(12) United States Patent
   Blanquart

(10) Patent No.: US 12,610,759 B2
(45) Date of Patent: Apr. 21, 2026

(54) TOPOLOGY-SELECTIVE NITRIDE DEPOSITION METHOD AND STRUCTURE FORMED USING SAME

(71) Applicant: ASM IP Holding B.V., Almere (NL)

(72) Inventor: Timothee Blanquart, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 657 days.

(21) Appl. No.: 17/902,272

(22) Filed: Sep. 2, 2022

(65) Prior Publication Data

US 2023/0084552 A1 Mar. 16, 2023

Related U.S. Application Data

(60) Provisional application No. 63/241,222, filed on Sep. 7, 2021.

(51) Int. Cl.
   *H01L 21/02* (2006.01)
   *H10D 30/01* (2025.01)

(52) U.S. Cl.
   CPC .. *H01L 21/02304* (2013.01); *H01L 21/02167* (2013.01); *H01L 21/0217* (2013.01); *H01L 21/02175* (2013.01); *H01L 21/02181* (2013.01); *H01L 21/02186* (2013.01); *H01L 21/02189* (2013.01); *H01L 21/02208* (2013.01); *H01L 21/02315* (2013.01); *H01L 21/0254* (2013.01); *H10D 30/024* (2025.01)

(58) Field of Classification Search
   CPC .......... H01L 21/02304; H01L 21/0228; C23C 16/45553; C23C 16/45527
   See application file for complete search history.

(56) References Cited

U.S. PATENT DOCUMENTS

| | | | | |
|---|---|---|---|---|
| 9,824,881 B2* | 11/2017 | Niskanen | ............ | H01L 21/0217 |
| 2020/0286726 A1* | 9/2020 | Shero | .................... | C23C 16/345 |
| 2022/0165569 A1 | 5/2022 | Liu | | |
| 2022/0165615 A1 | 5/2022 | Liu | | |

FOREIGN PATENT DOCUMENTS

TW 201903841 A 1/2019

OTHER PUBLICATIONS

Harm C. M. Knoops, Status and prospects of plasma-assisted atomic layer deposition, 2019, J. Vac. Sci. Technol. A, vol. 37 (Year: 2019).*

(Continued)

*Primary Examiner* — Davienne N Monbleau

*Assistant Examiner* — Emily Farmer

(74) *Attorney, Agent, or Firm* — Snell & Wilmer L.L.P.

(57) ABSTRACT

A topology-selective deposition method is disclosed. An exemplary method includes providing an inhibition agent comprising a first nitrogen-containing gas, providing a deposition promotion agent comprising a second nitrogen-containing gas to form an activated surface on one or more of a top surface, a bottom surface, and a sidewall surface relative to one or more of the other of the top surface, the bottom surface, and the sidewall surface, and providing a precursor to react with the activated surface to thereby selectively form material comprising a nitride on the activated surface.

20 Claims, 19 Drawing Sheets

(56) References Cited

OTHER PUBLICATIONS

Chaitanya Krishna Ande, Role of Surface Termination in Atomic Layer Deposition of Silicon Nitride, 2015, The Journal of Physical Chemistry Letters, vol. 6 (Year: 2015).*

Tirta Rona Mayangsari, Reactivity of different nitriding agents with chlorine-terminated surface during atomic layer deposition of silicon nitride, Jan. 1, 2021, Applied Surface Science, vol. 535 (Year: 2021).*

* cited by examiner

TOPOLOGY-SELECTIVE NITRIDE DEPOSITION METHOD AND STRUCTURE FORMED USING SAME

CROSS-REFERENCE TO RELATED APPLICATIONS

This application claims priority to U.S. Provisional Patent Application Ser. No. 63/241,222 filed Sep. 7, 2021, titled TOPOLOGY-SELECTIVE NITRIDE DEPOSITION METHOD AND STRUCTURE FORMED USING SAME, the disclosure of which is hereby incorporated by reference in its entirety.

FIELD OF INVENTION

The present disclosure generally relates to methods that include selective formation of material on a surface of a substrate. More particularly, the disclosure relates to methods of forming structures that include a topology-selectively nitride deposited material.

BACKGROUND OF THE DISCLOSURE

During the formation of devices, such as semiconductor devices, it is often desirable to form patterned features on a surface of a substrate. Typically, to form patterned features, a layer of material (e.g., silicon or other nitride) is deposited, the deposited layer is then patterned using, for example, photolithography techniques, and then the film is etched to formed features including the material.

As device features continue to decrease in size, it becomes increasingly difficult to pattern and etch nitride layers to form features of desired dimensions. And, lithography and etch steps can increase costs associated with device manufacturing and increase an amount of time required for device fabrication. Furthermore, in some cases, it may be desirable to form material overlying features topology-selectively (topo-selectively). For example, it may be desirable to form topo-selective material at a top and/or bottom of a structure. In such cases, typical deposition, pattern, and etch techniques may not be well suited—particularly as a size of the features continues to decrease.

Accordingly, improved methods for topo-selective formation of materials are desired.

SUMMARY OF THE DISCLOSURE

Various embodiments of the present disclosure relate to topology-selective deposition methods, to structures formed using the methods, and to systems for performing the methods. While the ways in which various embodiments of the present disclosure address drawbacks of prior methods and structures are discussed in more detail below, in general, embodiments of the disclosure provide improved topo-selective methods that include depositing a nitride layer—e.g., selectively forming nitride material at a top, a bottom, or a top and bottom of patterned structures on a substrate surface.

In accordance with exemplary embodiments of the disclosure, a topology-selective deposition method includes providing a substrate comprising patterned structures on a surface of the substrate, the patterned structures each comprising a top surface, a bottom surface, and a sidewall surface therebetween; providing an inhibition agent comprising a first nitrogen-containing gas to form an inhibited surface on one or more of the top surface, the bottom surface, and the sidewall surface; providing a deposition promotion agent comprising a second nitrogen-containing gas to form an activated surface on one or more of the top surface, the bottom surface, and the sidewall surface relative to one or more of the other of the top surface, the bottom surface, and the sidewall surface; providing a precursor to react with the activated surface; and selectively forming material comprising a nitride on the activated surface, wherein the first nitrogen-containing gas and the second nitrogen-containing gas differ. One or more of the first nitrogen-containing gas and the second nitrogen-containing gas can be activated using one or more of a direct, indirect, or remote plasma apparatus or module to form activates species from the respective nitrogen-containing gas. The step of providing an inhibition agent can include forming a plasma using the first nitrogen-containing gas and/or thermally activating the first nitrogen-containing gas. In accordance with further examples of the disclosure, the step of providing a deposition promotion agent comprises forming a plasma using the second nitrogen-containing gas. In accordance with further examples of the disclosure, one of the first and second nitrogen-containing gases includes hydrogen and the other of the first and second nitrogen-containing gases does not include hydrogen. In accordance with further examples of the disclosure, one of the first and second nitrogen-containing gases or species respectively formed therefrom react with a surface to create dangling bonds and the other of the first and second nitrogen-containing gases or species respectively formed therefrom react with the surface to create —NH terminal bonds. In accordance with further examples, the material selectively forms on the top surface relative to the bottom surface and the sidewall. In accordance with further examples, the material selectively forms on the bottom surface relative to the top surface and the sidewall. In accordance with yet additional examples, the material selectively forms on the bottom surface and the top surface relative to the sidewall.

In accordance with additional embodiments of the disclosure, a structure includes a topo-selective nitride material layer. The topo-selective nitride material can be deposited using a method as described herein. The topo-selective nitride material can be or include, for example, silicon nitride, titanium nitride (TiN), molybdenum nitride (MoN), gallium nitride (GaN), hafnium nitride (HfN), zirconium nitride (ZrN), tungsten nitride (WN), or the like.

In accordance with further examples of the disclosure, a system is provided. The system can be configured to perform a method as described herein and/or to form a structure as described herein.

These and other embodiments will become readily apparent to those skilled in the art from the following detailed description of certain embodiments having reference to the attached figures; the invention not necessarily being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
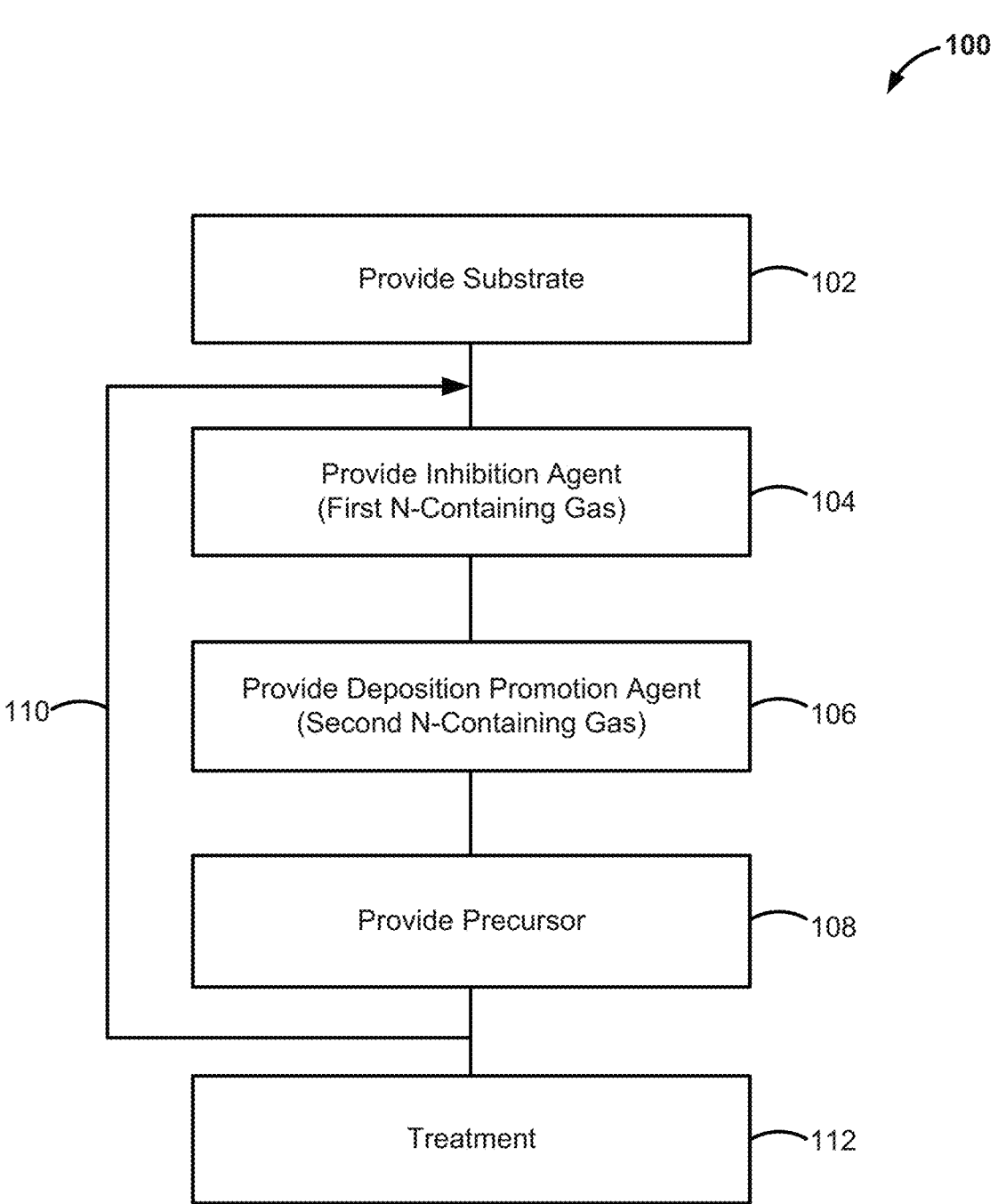
FIG. 1 illustrates a topology-selective deposition method in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to topology-selective deposition methods, structures formed using the methods, and systems that can be used to perform the methods and/or form the structures. As described in more detail below, exemplary methods can be used to form device structures suitable for forming electronic devices. For example, exemplary methods can be used to form features that include topology-selective deposited nitride material suitable for use as, for example, an etch stop layer. Unless otherwise noted, examples of the disclosure are not necessarily limited to such applications.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent. In some cases, the terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various structures, such as recesses, vias, lines, and the like formed within or on at least a portion of a layer of the substrate.

As used herein, the term cyclical deposition may refer to the sequential introduction of precursors/reactants into a reaction chamber to deposit a layer over a substrate and includes processing techniques such as atomic layer deposition and cyclical chemical vapor deposition.

As used herein, the term atomic layer deposition (ALD) may refer to a vapor deposition process in which deposition cycles, typically a plurality of consecutive deposition cycles, are conducted in a process chamber. Generally, during each cycle, a precursor is chemisorbed to a deposition surface (e.g., on activated sites), forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface and/or to form additional activated sites. Further, purging steps can also be utilized during each cycle to remove excess precursor from the process chamber and/or remove excess reactant and/or reaction byproducts from the process chamber after conversion of the chemisorbed precursor. The term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge gas(es).

As used herein, the term cyclical chemical vapor deposition may refer to any process wherein a substrate is sequentially exposed to two or more volatile precursors, which react and/or decompose on a substrate to produce a desired deposition.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. In some cases, a layer can refer to a region of material that has been topo-selectively formed or deposited. In some case, a layer may be or include dangling bonds or terminal functional groups. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers. The terms film and layer can be used interchangeably.

In this disclosure, continuously can refer to one or more of without breaking a vacuum, without interruption as a timeline, without any material intervening step, without changing treatment conditions, immediately thereafter, as a next step, or without an intervening discrete physical or chemical structure or layer between two structures or layers in some embodiments. For example, a reactant and/or a noble gas can be supplied continuously during two or more steps and/or deposition cycles of a method.

As used herein, the term purge may refer to a procedure in which an inert or substantially inert gas (i.e., a gas that does not take part in a chemical reaction to an appreciable extent) is provided to a reactor chamber in between pulses of other (e.g., reactant or precursor) gases. For example, a purge may be provided between a precursor pulse and a reactant pulse, thus avoiding or at least reducing gas phase interactions between the precursor and the reactant. It shall be understood that a purge can be effected either in time or in space or both. For example, in the case of temporal purges, a purge step can be used, e.g., in the temporal sequence of providing a first precursor to a reactor chamber, providing a purge gas to the reactor chamber, and providing a second precursor to the reactor chamber, wherein the substrate on which a layer is deposited does not move. In the case of spatial purges, a purge step can take the form of moving a substrate from a first location to which a first precursor is supplied, through a purge gas curtain, to a second location to which a second precursor/reactant/treatment gas is supplied.

As used herein, material comprising a nitride refers to a material that includes nitrogen. Exemplary materials comprising a nitride include titanium nitride (TiN), molybdenum nitride (MoN), gallium nitride (GaN), hafnium nitride (HfN), zirconium nitride (ZrN), tungsten nitride (WN), or the like, silicon carbon nitride, and silicon nitride. In some cases, the nitride may not include stoichiometric nitride material. In some cases, the nitride can include other elements, such as carbon, oxygen, hydrogen, or the like.

As used herein, silicon nitride refers to a material that includes silicon and nitrogen. Silicon nitride can be represented by the formula $Si_3N_4$. In some cases, the silicon nitride may not include stoichiometric silicon nitride. In some cases, the silicon nitride can include other elements, such as carbon, hydrogen, or the like.

Silicon carbon nitride (SiCN) can refer to material that includes silicon, carbon, and nitrogen. As used herein, unless stated otherwise, SiCN is not intended to limit, restrict, or define the bonding or chemical state, for example, the oxidation state of any of Si, C, N, and/or any other element in the film. In some embodiments, SiCN thin films may comprise one or more elements in addition to Si, C, and N, such as H. In some embodiments, the SiCN films may comprise Si—C bonds and/or Si—N bonds. In some embodiments, the SiCN films may comprise Si—H bonds in addition to Si—C and/or Si—N bonds. In some embodiments, the SiCN films may comprise from about 0% to about 50% carbon on an atomic basis. In some embodiments, the SiCN films may comprise from about 0.1% to about 40%, from about 0.5% to about 30%, from about 1% to about 30%, or from about 5% to about 20% carbon on an atomic basis. In some embodiments, the SiCN films may comprise from about 0% to about 70% nitrogen on an atomic basis. In some embodiments, the SiCN films may comprise from about 10% to about 70%, from about 15% to about 50%, or from about 20% to about 40% nitrogen on an atomic basis. In some embodiments, the SiCN films may comprise about 0% to about 50% silicon on an atomic basis. In some embodiments, the SiCN films may comprise from about 10% to about 50%, from about 15% to about 40%, or from about 20% to about 35% silicon on an atomic basis. In some embodiments, the SiCN films may comprise from about 0.1% to about 40%, from about 0.5% to about 30%, from about 1% to about 30%, or from about 5% to about 20% hydrogen on an atomic basis. In some embodiments, the SiCN films may not comprise oxygen.

As used herein, the term overlap can mean coinciding with respect to time and within a reaction chamber. For example, with regard to gas pulse periods, such as precursor pulse periods and reactant pulse periods, two or more gas pulse periods can overlap when gases from the respective pulse periods are within the reaction chamber or provided to the reaction chamber or to a reactor fora period of time.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc., in some embodiments. Further, in this disclosure, the terms "including," "constituted by" and "having" can refer independently to "typically or broadly comprising," "comprising," "consisting essentially of," or "consisting of" in some embodiments. In accordance with aspects of the disclosure, any defined meanings of terms do not necessarily exclude ordinary and customary meanings of the terms.

Turning now to the figures, FIG. 1 illustrates a topology-selective deposition method 100 in accordance with examples of the disclosure. Method 100 includes the steps of providing a substrate (step 102), providing an inhibition agent (step 104), providing a deposition promotion agent (step 106), and providing a precursor (step 108); steps 104-108 can be repeated to form topology-selective (topo-selective) material (loop 110). Method 100 can also include an optional treatment step (112). Although illustrated in a particular sequence, examples of method 100 are not restricted to such order. Further, as discussed below, one or more steps of method 100 can overlap.

FIGS. 3-7 illustrate structures formed during method 100 in accordance with embodiments of the disclosure. The example illustrated in FIGS. 3-7 relates to a top surface topo-selective method. Additional examples of bottom topo-selective methods and top and bottom topo-selective methods are described further below.

During step 102, a substrate is provided, e.g., into a reaction chamber of a reactor. In accordance with examples of the disclosure, the reaction chamber can form part of a cyclical deposition reactor, such as an atomic layer deposition (ALD) reactor, and particularly a plasma-enhanced ALD (PEALD) reactor. Various steps of method 100 can be performed within a single reaction chamber or can be performed in multiple reaction chambers, such as reaction chambers of a cluster tool. Optionally, a reactor including the reaction chamber can be provided with a heater to activate the reactions by elevating the temperature of one or more of the substrate, the reaction chamber wall, and/or the reactants/precursors.

Figure 3:
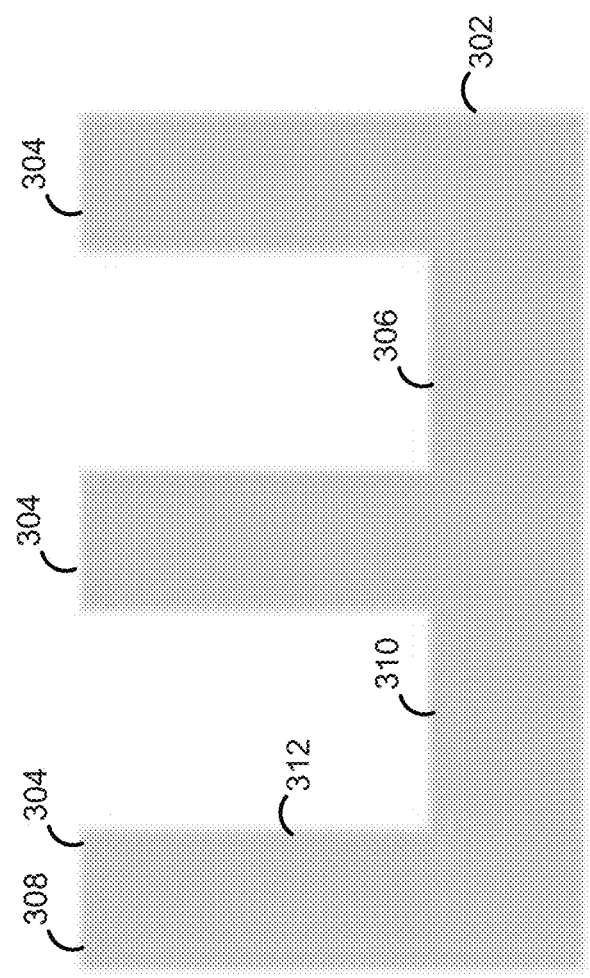
FIGS. 3-7 illustrate structures in accordance with examples of the disclosure.

An exemplary substrate 302 provided during step 102 is illustrated in FIG. 3. As illustrated, substrate 302 includes patterned structures 304 on a surface 306 of substrate 302. Patterned structures 304 include a top surface 308, a bottom surface 310, and a sidewall 312 therebetween. Patterned structure 304 can be formed, for example, as a via, between lines or protrusions, form part of a gap or recess, or the like. Thus, in some cases (e.g., for a via), sidewall 312 can span patterned structure 304, and in other cases, a gap (e.g., between lines or protrusions) can include a plurality of sidewalls 312.

During step 102, the substrate can be brought to a desired temperature and pressure for step 104. By way of examples, a temperature (e.g., of a substrate or a substrate support) within a reaction chamber can be between about 50° C. and about 600° C., or about 50° C. and about 300° C. or about 450° C. and about 600° C. A pressure within the reaction chamber can be about 0.1 to about 10 or about 10 to about 100 Torr.

Figure 4:
Figure 4:
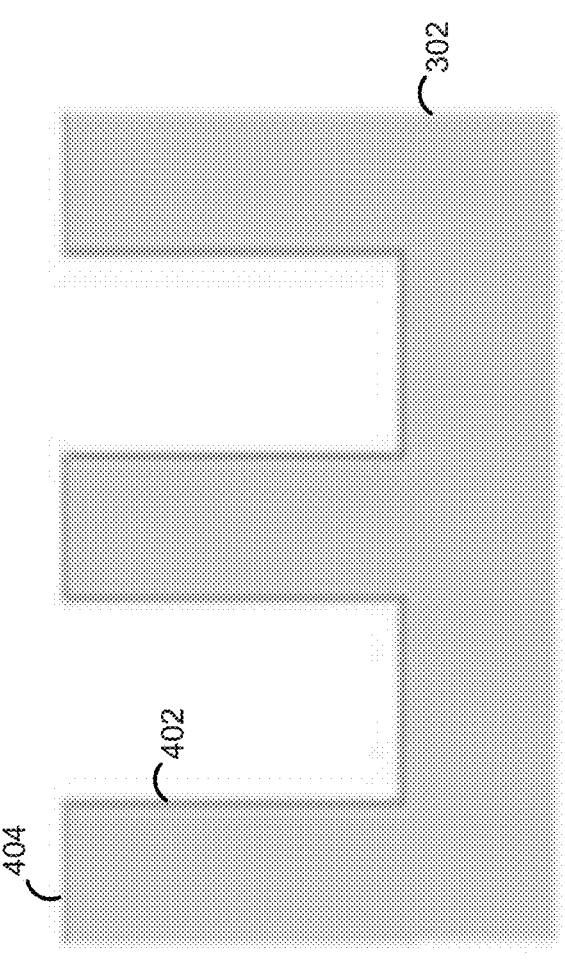

During step 104, an inhibition agent is provided within a reaction chamber. The inhibition agent reacts with at least a portion of surface 306 to form an inhibited surface on one or more of the top surface, the bottom surface, and the sidewall surface. FIG. 4 illustrates an example in which the inhibition agent reacts with top surface 308, bottom surface 310, and sidewall surface 312 to form inhibition layer 402. A desired composition of inhibition layer 402 can depend on a precursor used during step 108. In some cases, inhibition layer 402 comprises —NH terminal bonds (e.g., for use with precursors that do not readily react with such terminal bonds). In other cases, inhibition layer 402 includes (e.g., nitrogen) dangling bonds (e.g., for precursors that do not readily react with such dangling bonds).

In accordance with these examples, during step 104, the inhibition agent comprises a first nitrogen-containing gas, which is provided to a reaction chamber or to a plasma apparatus to form species that are provided to the reaction chamber. Exemplary first nitrogen-containing gases include hydrogen. In these cases, the first nitrogen-containing gas can be used to form —NH terminal bonds. Exemplary first nitrogen-containing gases that include hydrogen include a mixture of nitrogen and hydrogen (e.g., from about 1 to about 75 volumetric % hydrogen), ammonia, hydrazine, hydrazine derivatives, and the like. Suitable hydrazine derivatives can be represented by the general formula below, where each of R1-R4 can be independently selected from, for example, C1-C4 alkyl groups. Non-limiting example embodiments of an alkyl-hydrazine may comprise at least one of tertbutylhydrazine ($C_4H_9N_2H_3$), methylhydrazine ($CH_3NHNH_2$), and dimethylhydrazine ($(CH_3)_2N_2NH_2$).

Alternatively, the first nitrogen-containing gas does not include hydrogen—at least to any appreciable extent. For example, the first nitrogen-containing gas may comprise less than 1, 0.5, 0.1, 0.01, or 0.001 volume percent hydrogen. Non-limiting examples of such nitrogen-containing gases include nitrogen ($N_2$), alone, or in combination with one or more of helium and argon. In these cases, the first nitrogen-containing gas can be used to form dangling bonds as layer 402 on surface 306.

The inhibition agent may be thermally activated and/or activated using a direct and/or remote plasma apparatus. In the case of plasma activation, step 104 includes forming a plasma using the inhibition agent (i.e., the first nitrogen-containing gas). In the case of thermal activation, step 104 includes heating the substrate to a thermal activation temperature, such as a substrate temperature noted herein. Exemplary suitable plasma apparatus and process conditions are described below.

During step 106, a deposition promotion agent is provided—e.g., to the same reaction chamber used during step 104 or to a plasma apparatus and then to the reaction chamber. A pressure and temperature within the reaction chamber can be as described above in connection with step 104.

The deposition promotion agent comprises a second nitrogen-containing gas to form an activated surface (or activated sites) on one or more of the top surface, the bottom surface, and the sidewall surface relative to one or more of the other of the top surface, the bottom surface, and the sidewall surface. The deposition promotion agent can react with surface 306 and/or a surface 404 of layer 402 to provide reaction sites for the precursor provided during step 106.

The second nitrogen-containing gas can be or include any of the nitrogen-containing gases noted above in connection with the first nitrogen-containing gas. However, in accordance with examples of the disclosure, the first nitrogen-containing gas and the second nitrogen-containing gas differ. In some cases, the second nitrogen-containing gas can form activated sites on a surface by forming —NH terminal bonds. In other cases, the second nitrogen-containing gas can form activated sites on a surface by forming dangling bonds. In accordance with examples of the disclosure, the second nitrogen-containing gas does not comprise hydrogen. In other cases, the second nitrogen-containing gas comprises hydrogen. Whether the second nitrogen-containing gas comprises hydrogen or not can depend on the first nitrogen-containing gas, the precursor, and the function of the second nitrogen-containing gas.

In accordance with examples of the disclosure, step 106 includes forming a plasma using the deposition promotion agent (i.e., the second nitrogen-containing gas). Exemplary plasma apparatus and conditions are set forth below.

Figure 5:
Figure 5:
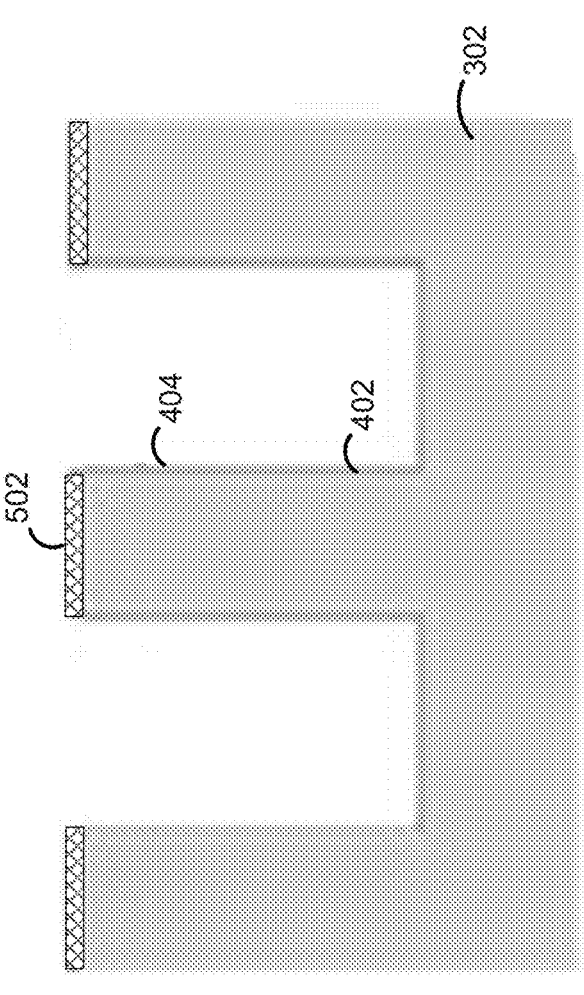

FIG. 5 illustrates a structure 500, which includes activated surface 502 overlying top surface 308, relative to bottom surface 310 and sidewall 312. In other cases, an activated surface can be formed overlying bottom surface 310 relative to top surface 308 or formed overlying top surface 308 and bottom surface 310, relative to sidewall 312.

During step 108, a precursor is provided to a reaction chamber—e.g., in the same reaction chamber used during step 104 or 106. The precursor reacts with activated surface 502, relative to a non-activated/inhibited surface (e.g., surface 404) to topo-selectively form material.

Exemplary precursors includes silicon precursors, such as silanes, silylamines, halosilanes, and alkyl and halogen-substituted halines.

As noted above, some precursors may preferentially react with activated sites comprising (e.g., nitrogen) dangling bonds. Exemplary precursors that react with such activated cites include silanes, silylamines, and aminosilanes. Particular examples include silane ($SiH_4$), disilane ($Si_2H_6$), trisilane ($Si_3H_8$), tetrasilane ($Si_4H_{10}$), $N(Si_2H_5)_3$, trisilylamine $N(SiH_3)_3$, $N(SiMe_3)(SiHMeNMe_2)_2$, 2,2-disilyltrisilane ($Si(SiH_3)_4$), trisdimethylaminosilane ($SiH(NMe_2)_3$), bis(diethylamino)silane ($SiH2(NEt_2)_2$) (BEDAS), bis(tert-butylamino)silane ($SiH_2(NHtBu)_2$) (BTBAS), di-isopropylamido)silane ($SiH_3(N^iPr_2)$) (DIPAS), where Me represents a methyl group, Et represents an ethyl group, tBu represents a tert-butyl group, and $^iPr$ represents an isopropyl group. Alternatively, some precursors may preferentially react with activated cites comprising —NH terminal bonds. Exemplary precursors that react with such activated cites include halogenated silicon compounds, such silicon compounds comprising one or more of Cl and I. Particular examples include trichloro disilane ($Si_2Cl_3H_3$), pentachloro disilane ($Si_2Cl_5H$), hexachloro disilane ($Si_2Cl_6$), octachlorotrisilane ($Si_3Cl_8$), dechloro silane ($SiCl_2H_2$), dimethyldichlorosilane ($SiCl_2Me_2$), tetrachloro silane ($SiCl_4$), tetraiodo silane ($SiI_4$), triiodo silane ($SiI_3H$), and deiodo silane ($SiI_2H_2$).

Figure 6:
Figure 6:
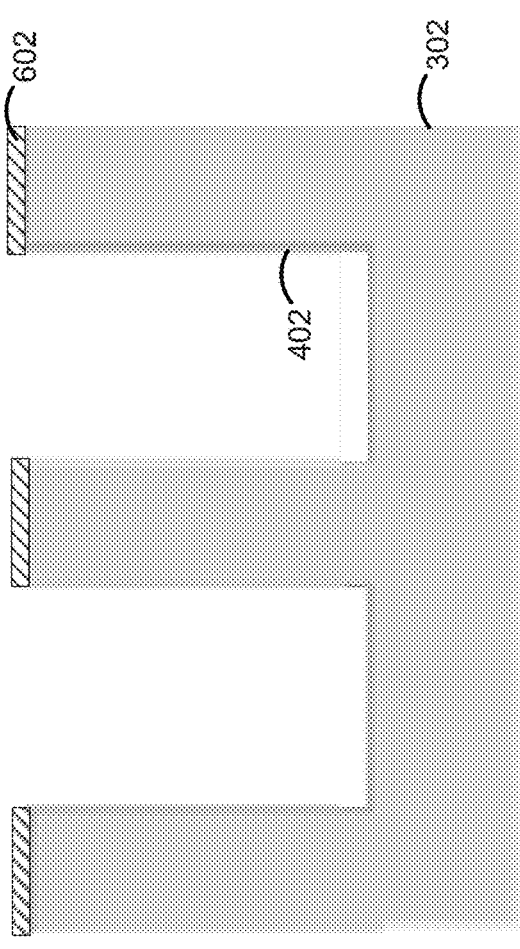

FIG. 6 illustrates a structure 600 after step 108. Structure 600 includes a layer of chemisorbed or otherwise deposited material 602. In the illustrated example, the precursor provided during step 108 reacts with activated surface 502 to (topo-) selectively form deposited material 602 comprising a nitride.

Steps 104-108 can be repeated a number of times (loop 110) until a desired thickness of deposited material 602 is formed overlying top surface 308. A number of cycles can range from, for example, about 1 to about 100,000 or about 2 to about 50,000 or about 1 to about 10. Once a desired thickness is reached and/or a predetermine number of cycles are performed, deposited material 602 can be treated.

Figure 7:
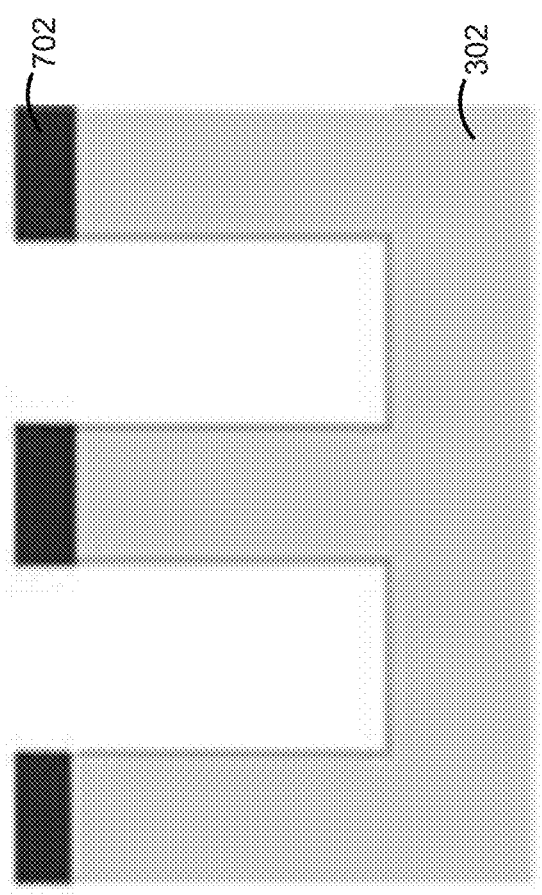

Treatment step 112 can be used to increase a density or densify deposited material 602 to formed structure 700, including treated material 702, illustrated in FIG. 7. Treatment step 112 can include a plasma-enhanced process and can be performed in the same reaction chamber used during any of steps 104-110. A gas used during treatment step 112 can include nitrogen and/or one or more noble gases, such as helium and argon.

Although not separately illustrated, exemplary methods can also include a step of removing a portion of the material from the sidewall. Such a step can be performed using wet and/or dry etch processes.

Figure 2:
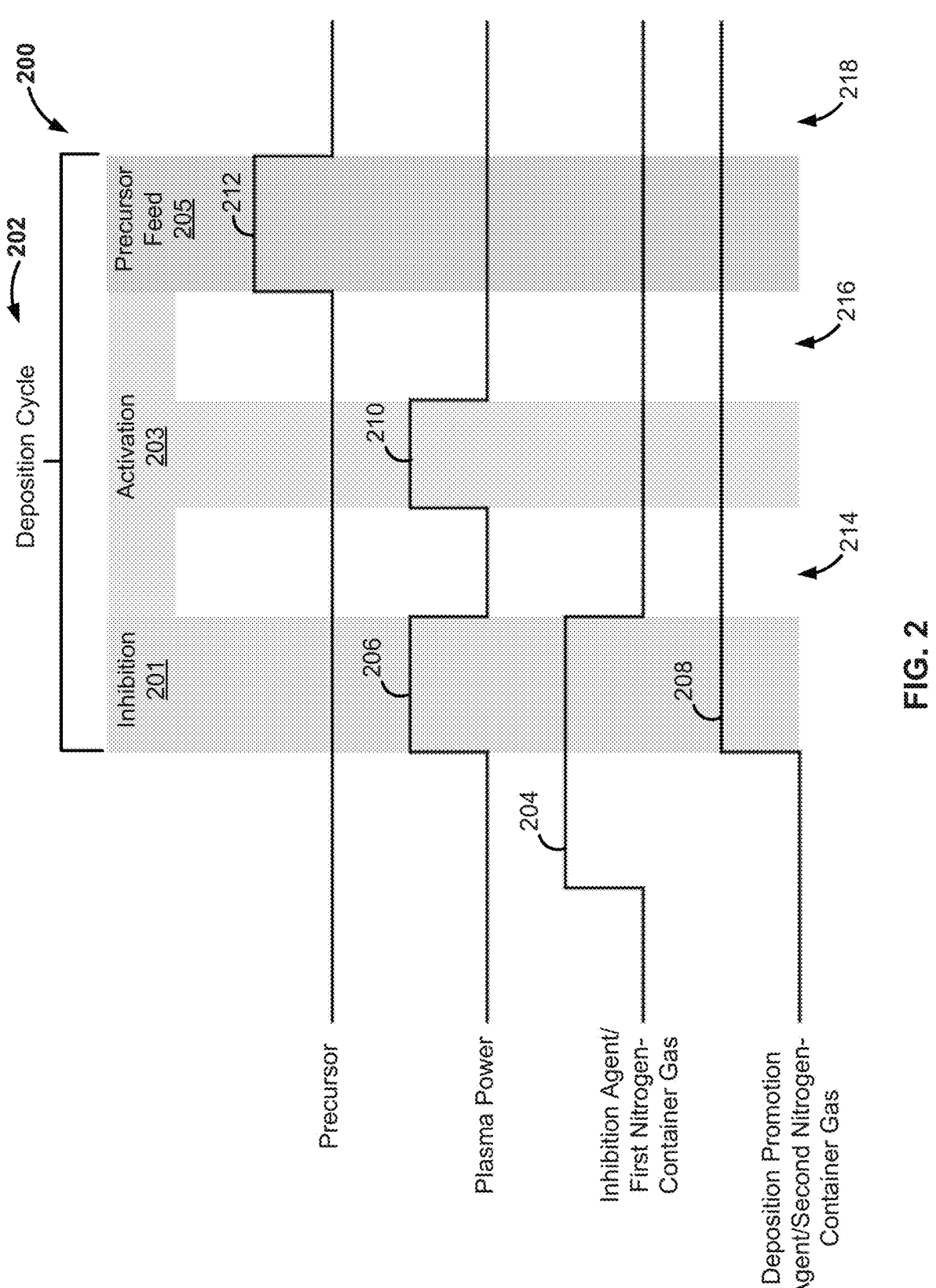
FIG. 2 illustrates a timing sequence suitable for use with the method illustrated in FIG. 1.

FIG. 2 illustrates a timing sequence 200 in accordance with examples of the disclosure. Method 100 can be performed using timing sequence 200. In the illustrated example, timing sequence 200 includes one or more deposition cycles 202. Although not illustrated in FIG. 2, methods employing sequence 200 can include a treatment step, such as treatment step 112 or other treatment step described herein. Sequence 200 can be used to topo-selectively deposit material on a top surface of a structure.

In the illustrated example, each deposition cycle 202 includes an inhibition segment 201, an activation segment 203, and a precursor feed segment 205. Further, each deposition cycle 202 includes an inhibition agent pulse 204, an inhibition plasma power pulse 206, a deposition promotion agent pulse 208, a deposition promotion plasma power pulse 210, and a precursor feed pulse 212. Deposition cycle(s) 202 can be the same or similar to steps 104-108 described above.

Inhibition agent pulse 204 can be the same or similar to step 104. A duration of inhibition agent pulse 204 can be about 0.1 to about 60 s or about 60 to about 300 seconds. A flowrate of the inhibition agent during inhibition agent pulse 204 can be about 10 to about 100 or about 100 to about 3000 sccm. In the illustrated example, the inhibition agent is plasma activated during inhibition plasma power pulse 206.

During inhibition plasma power pulse 206, a suitable power is applied to form a plasma using the inhibition agent supplied to the reaction chamber and/or plasma apparatus during pulse 204. A duration of inhibition plasma power pulse 206 can be about 0.1 to about 6 s or about 60 to about 300 seconds. A power used to form the plasma during inhibition plasma power pulse 206 can be about 50 to about 300 or about 300 to about 1000 W.

Deposition promotion agent pulse 208 can be continuous during one or more deposition cycles 202 and optionally during any treatment step. The deposition promotion agent can be used during one or more purge steps 214-218. A flowrate of the deposition promotion agent during pulse 208 can be about 10 to about 100 or about 100 to about 3000 sccm.

During deposition promotion plasma power pulse 210, a suitable power is applied to form a plasma using the deposition promotion agent supplied to the reaction chamber during pulse 208. A duration of deposition promotion plasma power pulse 210 can be about 0.1 to about 60 s or about 60 to about 300 seconds. A power used to form the plasma during inhibition plasma power pulse 206 can be about 50 to about 300 or about 300 to about 1000 W.

During precursor pulse 212, a precursor, such as a precursor described herein, is provided to the reaction chamber. A duration of precursor pulse 212 can be about 0.01 to about 5 or about 5 to about 60 seconds. A flowrate of the precursor during precursor pulse 212 can be about 50 to about 500 or about 500 to about 3000 sccm. In the illustrated example, the precursor is thermally activated—that is, a plasma power is not applied during pulse 212.

Exemplary process conditions for sequence 200 are shown below in Table 1. The conditions noted below are merely exemplary and are not meant to limit the scope of the invention.

TABLE 1

| Condition | | | |
|---|---|---|---|
| | Precursor (e.g., C1-C4 silane, such as silane) | sccm | 200 |
| | Inhibition Agent (NH$_3$) | sccm | 500 |
| | H$_2$ | sccm | 0 |
| | Deposition Promotion Agent (N$_2$) | sccm | 4000 |
| | Carrier 1 N$_2$ | sccm | 1000 |
| | Reaction Chamber Pressure | Pa | 300 |
| | Inhibition Plasma Power | W | 0 |
| | Deposition Promotion Plasma Power | W | 100 |
| | Treatment Plasma Power | W | 300 |
| | Substrate Temperature | C. | 400 |
| | Inhibition Agent Purge | | 2.0 |
| step time | Inhibition Agent Flow | | 5.0 |
| [sec.] | Inhibitor Off | | 2.0 |
| | Deposition Activation | | 0.5 |
| | Precursor Source Feed | | 0.3 |
| | Precursor Source Purge | | 0.5 |

Figure 17:
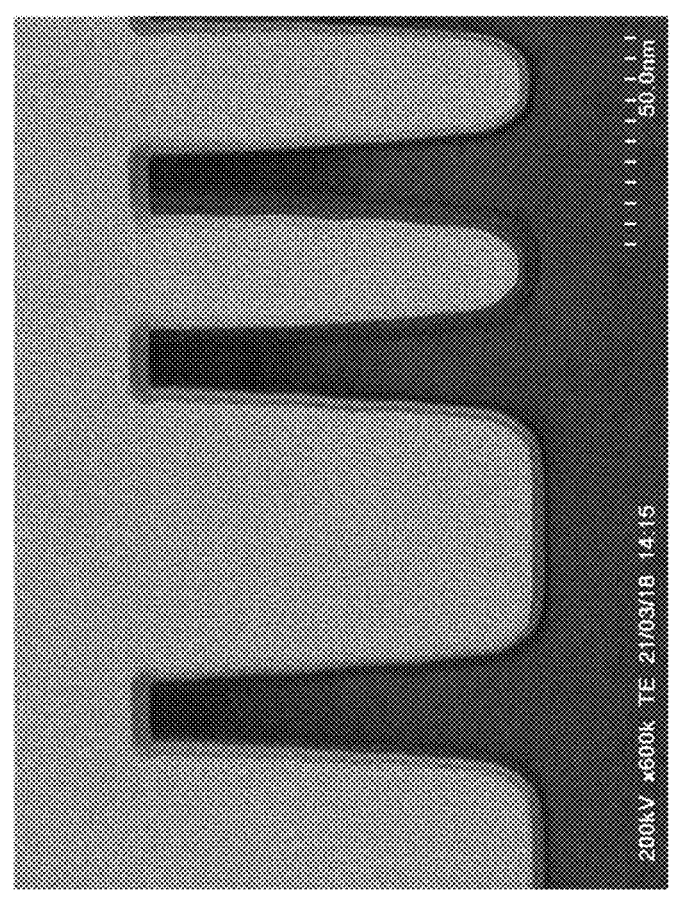
FIGS. 17-19 illustrate scanning transmission electron micrographs of structures formed in accordance with examples of the disclosure.
Figure 18:
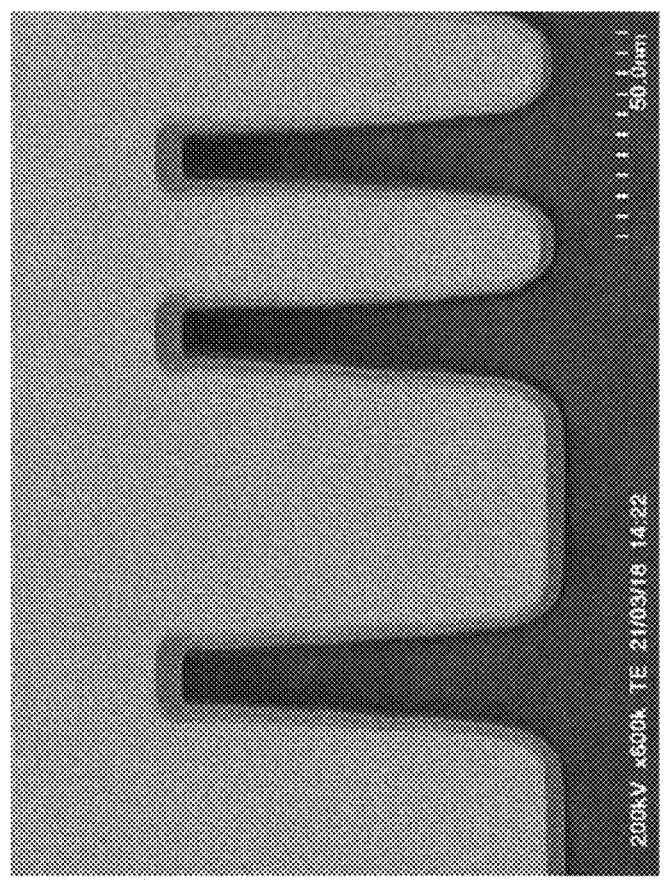
Figure 19:
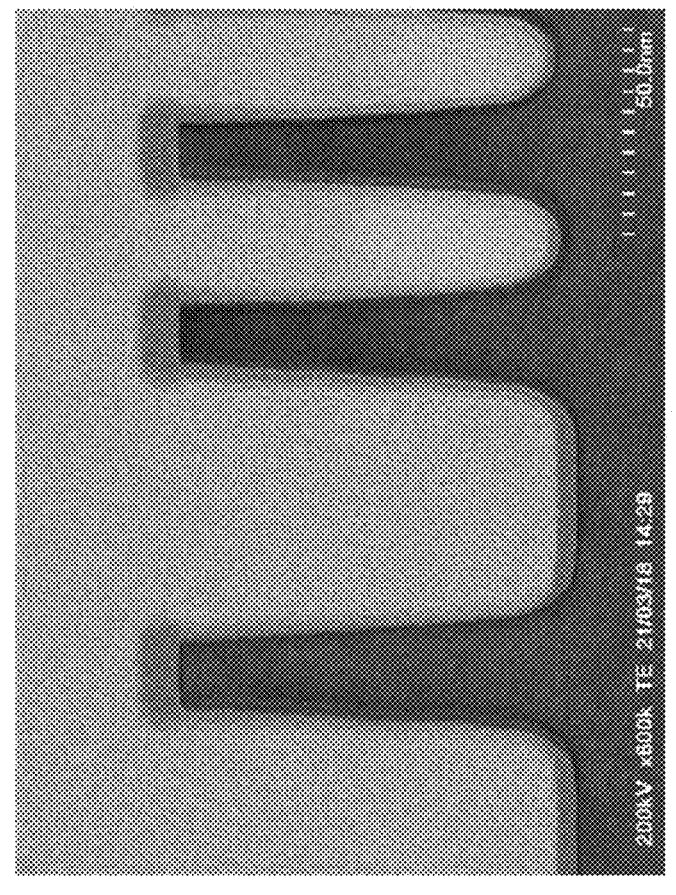

FIGS. 17-19 illustrate micrographs of structures formed using timing sequence 200. In FIG. 17, the structure was formed using a thermal inhibition process, where the inhibition agent was NH$_3$. The activation agent included nitrogen gas, and the silicon precursor was a silane, such as a C1-C4 silane, and particularly silane. The structure of FIG. 18 was formed using the conditions set forth in Table 1, above. The structure of FIG. 19 was formed under similar conditions as the structure illustrated in FIG. 18, except the inhibition agent comprised a mixture of hydrogen and nitrogen gas.

Figure 8:
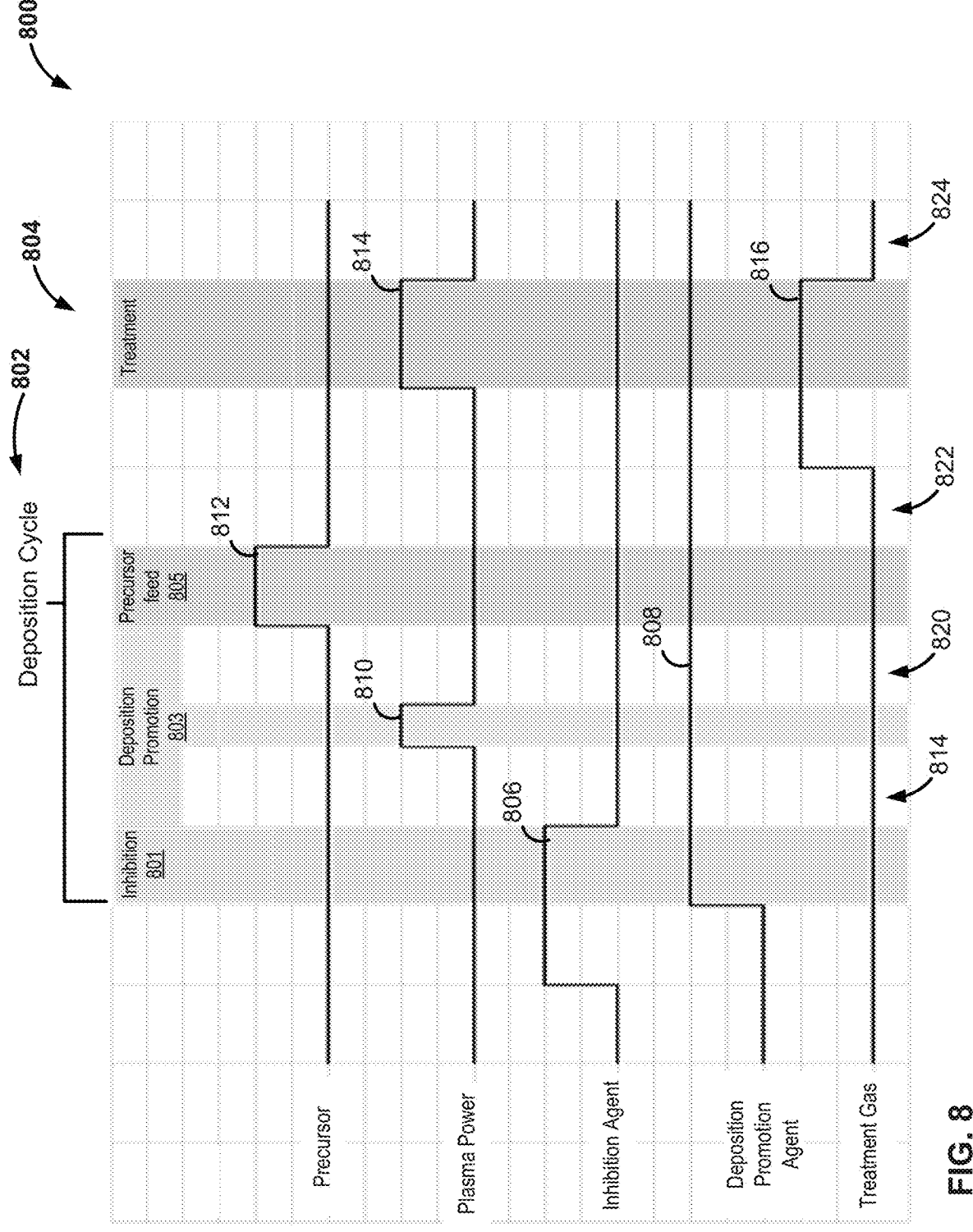
FIG. 8 illustrates another timing sequence suitable for use with the method illustrated in FIG. 1.

FIG. 8 illustrates another timing sequence 800 in accordance with examples of the disclosure. In the illustrated example, timing sequence 800 includes one or more deposition cycles 802 and a treatment step 804.

Deposition cycle(s) 802 can be the same or similar to steps 104-108 described above. Each deposition cycle 802 can include an inhibition agent pulse 806, a deposition promotion agent pulse 808, a deposition promotion plasma power pulse 810, and a precursor pulse 812. Further, each deposition cycle 802 can include an inhibition segment 801, a deposition promotion segment 803, and a precursor feed segment 805.

Inhibition agent pulse 806 can be the same or similar to step 104. A duration of inhibition agent pulse 806 can be about 0.1 to about 60 s or about 60 to about 300 seconds. A flowrate of the inhibition agent during inhibition agent pulse 806 can be about 10 to about 100 or about 100 to about 3000 sccm. In the illustrated example, the inhibition agent is thermally activated—that is, a plasma power is not applied during pulse 806.

As illustrated, deposition promotion agent pulse 808 can be continuous during one or more deposition cycles 802 and during a treatment step 804. The deposition promotion agent can be used during one or more purge steps 818-824. A flowrate of the deposition promotion agent during one or more purge steps 818-824 can be about 10 to about 100 or about 100 to about 3000 sccm.

During deposition promotion plasma power pulse 810, a suitable power is applied to form a plasma using the deposition promotion agent. A duration of deposition promotion plasma power pulse 810 can be about 0.1 to about 60 s or about 60 to about 300 seconds. A power used to form the plasma during plasma power pulse 810 can be about 50 to about 300 or about 300 to about 1000 W.

During precursor pulse 812, a precursor, such as a precursor described herein, is provided to the reaction chamber. A duration of precursor pulse 812 can be about 0.01 to about 5 or about 5 to about 60 seconds. A flowrate of the precursor during precursor pulse 812 can be about 50 to about 500 or about 500 to about 3000 sccm. Similar to timing sequence 200, in this example, the precursor is thermally activated—that is, a plasma power is not applied during pulse 812.

Once a desired number of deposition cycles are completed, treatment gas is provided to the reaction chamber during a treatment gas pulse 816. A duration of treatment gas pulse 816 can be about 0.1 to about 60 s or about 60 to about 300 seconds. A flowrate of the treatment gas during treatment gas pulse 816 can be about 10 to about 100 or about 100 to about 3000 sccm. As illustrated, treatment gas pulse 816 may begin prior to pulse 814, to allow a pressure within the reaction chamber and/or a flow of the treatment gas to stabilize prior to treatment power plasma pulse 814.

During a treatment power plasma pulse 814, a plasma power can be applied to create a plasma using the treatment gas provided during pulse 816 and the deposition promotion agent gas provided during pulse 808. A duration of treatment plasma power pulse 814 can be about 0.1 to about 60 s or about 60 to about 300 seconds. A power used to form the plasma during plasma power pulse 814 can be about 50 to about 300 or about 300 to about 1000 W.

Exemplary process conditions for timing sequence 800 using various inhibition agents (thermal and plasma activated) are provided below in Table 2.

TABLE 2

| | Condition | | NH₃ inhibitor | NH₃ inhibitor with RF | N₂/H₂ inhibitor with RF |
|---|---|---|---|---|---|
| | Precursor flow | sccm | 200 | 200 | 200 |
| | Inhibition agent | sccm | 200 | 200 | |
| | H₂ | sccm | | | 200 |
| | P—N₂ | sccm | 4000 | 4000 | 4000 |
| | Carrier 1 N₂ | sccm | 1000 | 1000 | 1000 |
| | RC Pressure | Pa | 300 | 300 | 300 |
| | Inhibition Plasma Power | W | 0 | 120 | 120 |
| | Activation Plasma Power | W | 100 | 100 | 100 |
| | Treatment power | W | 100 | 100 | 100 |
| | Substrate temperature | C. | 400 | 400 | 400 |
| | Gap between susceptor and top electrode | mm | 12 | 12 | 12 |
| step time [sec.] | Inhibition plasma power | | 2.0 | 2.0 | 2.0 |
| | Inhibition agent flow | | 5.0 | 5.0 | 5.0 |
| | Inhibition agent purge | | 5.0 | 5.0 | 5.0 |
| | Deposition promotion plasma power | | 0.05, 0.2, 0.5 | 0.05, 0.2, 0.5 | 0.05, 0.2, 0.5 |
| | Precursor Feed | | 2.0 | 2.0 | 2.0 |
| | Precursor Purge | | 3.0 | 3.0 | 3.0 |
| | Treatment power | | 1.0 | 1.0 | 1.0 |
| | Treatment Purge | | 0.2 | 0.2 | 0.2 |
| | Total | | 16.4 | 16.4 | 16.4 |

Figure 9:
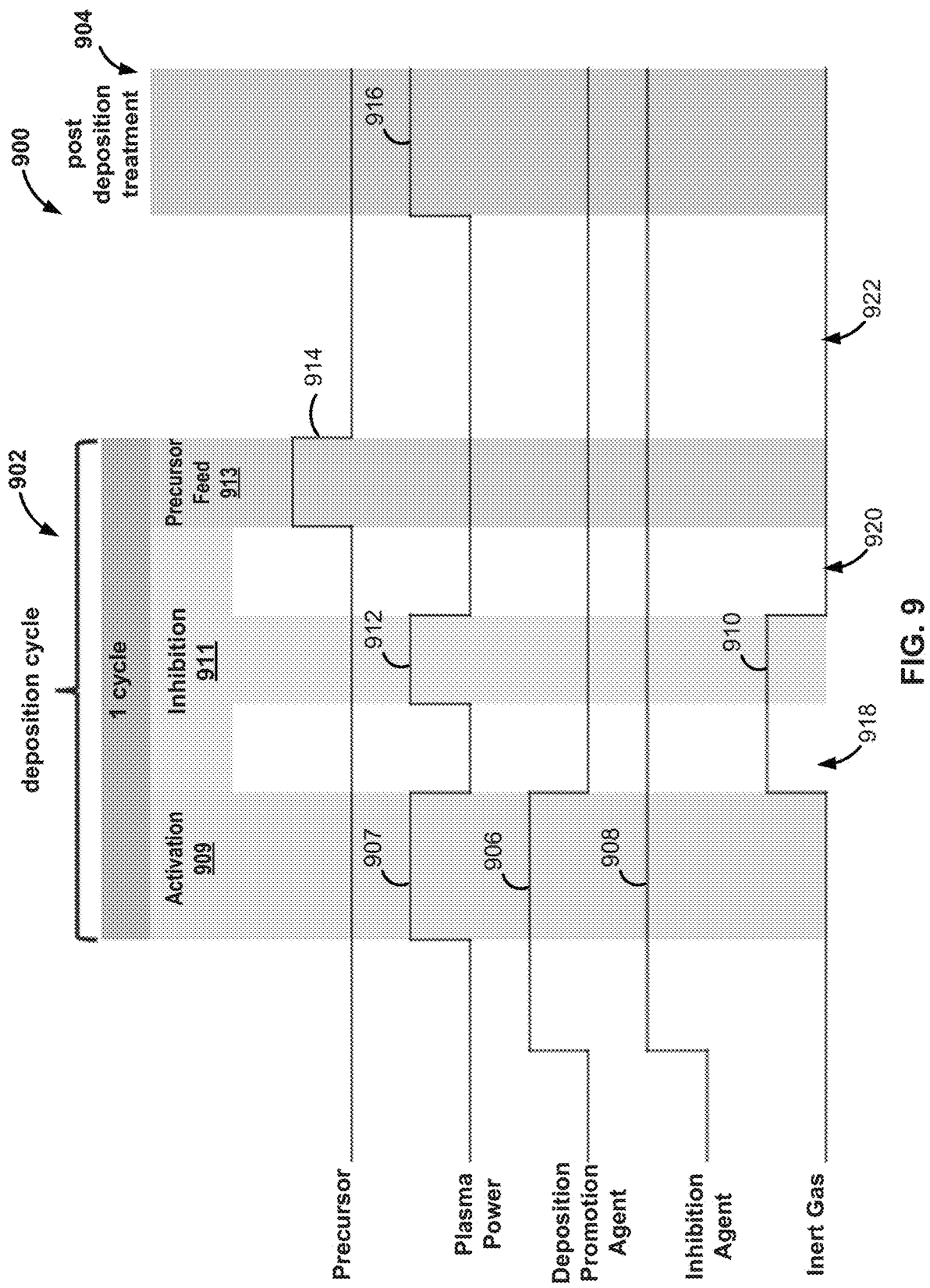
FIG. 9 illustrates another timing sequence suitable for use with the method illustrated in FIG. 1.

FIG. 9 illustrates yet another timing sequence 900 in accordance with examples of the disclosure. Timing sequence 900 can be used in connection with method 100. In the illustrated example, timing sequence 900 includes one or more deposition cycles 902 and a treatment step 904. FIGS. 10-15 illustrate structures formed using timing sequence 900, which can be used to selectively deposit material on a bottom surface of a structure.

Figure 10:
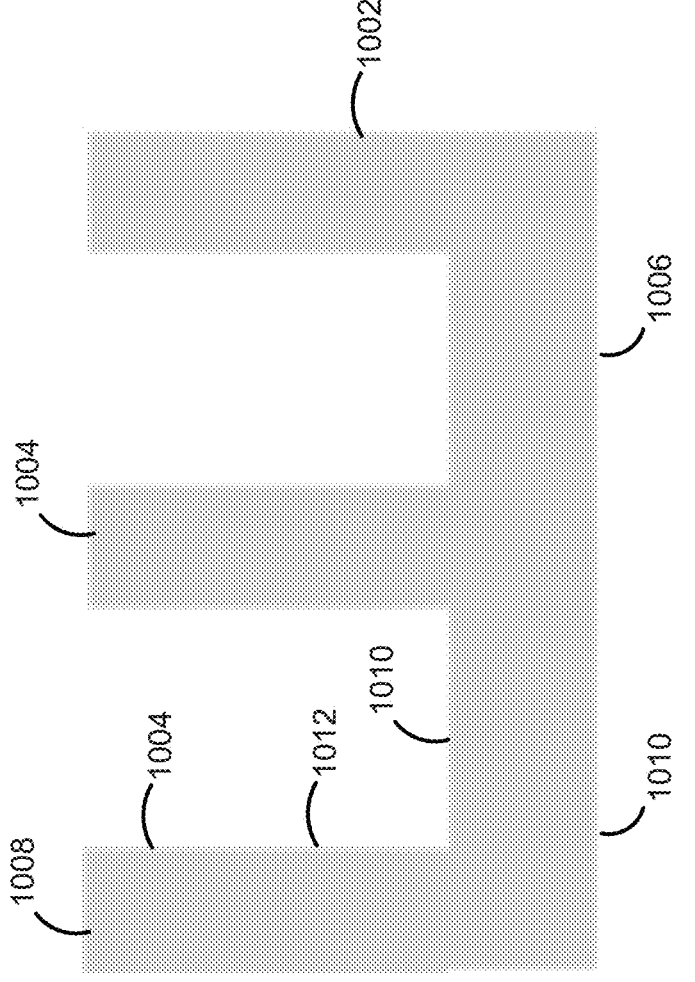
FIGS. 10-15 illustrate structures in accordance with additional examples of the disclosure.

FIG. 10 illustrates a substrate 1002, which can be the same or similar to substrate 302. Substrate 1002 includes patterned structures 1004 on a surface 1006 of substrate 1002. Patterned structures 1004 include a top surface 1008, a bottom surface 1010, and a sidewall 1012 therebetween.

Deposition cycle(s) 902 can be the same or similar to steps 104-108 described above. As illustrated, each deposition cycle 902 includes a deposition promotion agent pulse 906, an inhibition agent pulse 908, a deposition promotion plasma power pulse 907, an inhibition plasma power pulse 912, and a precursor feed pulse 914. Further, each deposition cycle can include an activation segment 909, an inhibition segment 911, and a precursor feed segment 913.

As illustrated, deposition promotion agent pulse 906 can be provided during activation segment 909. Deposition promotion agent pulse 906 can be the same or similar to step 106 described above. A flowrate of the deposition promotion agent during pulse 906 can be about 10 to about 100 or about 100 to about 3000 sccm. A duration of deposition promotion agent pulse 906 can be about 0.1 to about 60 s or about 60 to about 300 seconds.

During activation segment 909, deposition promotion power pulse 907 can be performed while the inhibition agent and the deposition promotion agent are flowed to the reaction chamber. During deposition promotion plasma power pulse 907, a suitable power is applied to form a plasma using the inhibition agent supplied to the reaction chamber during pulse 908 and the deposition promotion agent supplied during pulse 906. A duration of deposition promotion plasma power pulse 907 can be about 0.1 to about 60 s or about 60 to about 300 seconds. A power used to form the plasma during deposition promotion plasma power pulse 907 can be about 50 to about 300 or about 300 to about 1000 W.

Inhibition agent pulse 908 can be the same or similar to step 104. A flowrate of the inhibition agent during inhibition agent pulse 908 can be about 10 to about 100 or about 100 to about 3000 sccm.

Figure 11:
Figure 11:
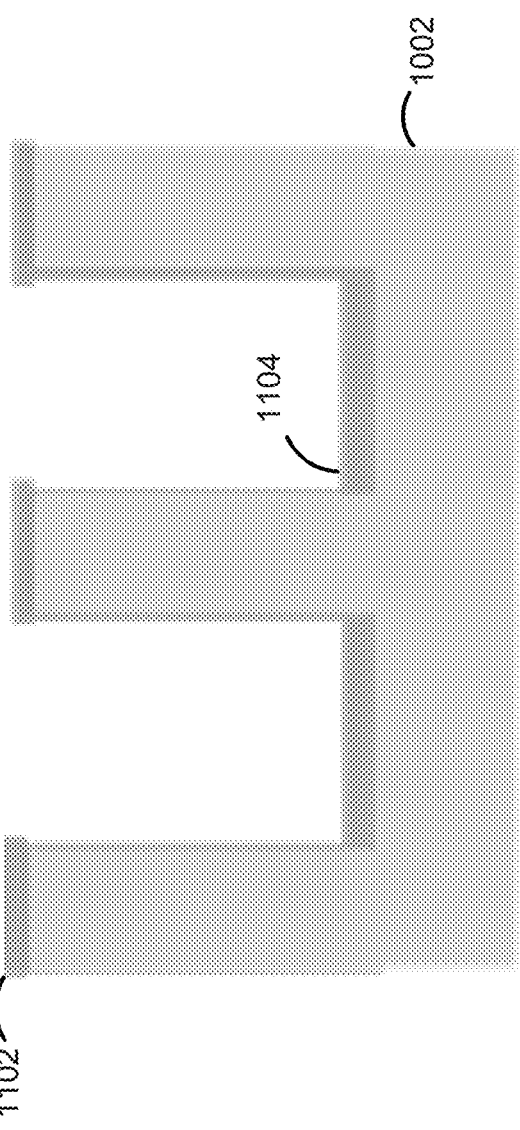

With reference to FIGS. 9 and 11, during activation segment 909, activated surface 1102, 1104 are preferentially formed overlying top surface 1008 and bottom surface 1010.

During inhibition segment 911, inhibition power pulse 912 may be performed while the inhibition agent continues to flow. Optionally, a noble gas can be provided during noble gas pulse 910. During inhibition plasma power pulse 912, a suitable power is applied to form a plasma using the inhibition agent supplied to the reaction chamber during pulse 204. A duration of inhibition plasma power pulse 912 can be about 0.1 to about 60 s or about 60 to about 300 seconds. A power used to form the plasma during inhibition plasma power pulse 912 can be about 50 to about 300 or about 300 to about 1000 W.

Figure 12:
Figure 12:
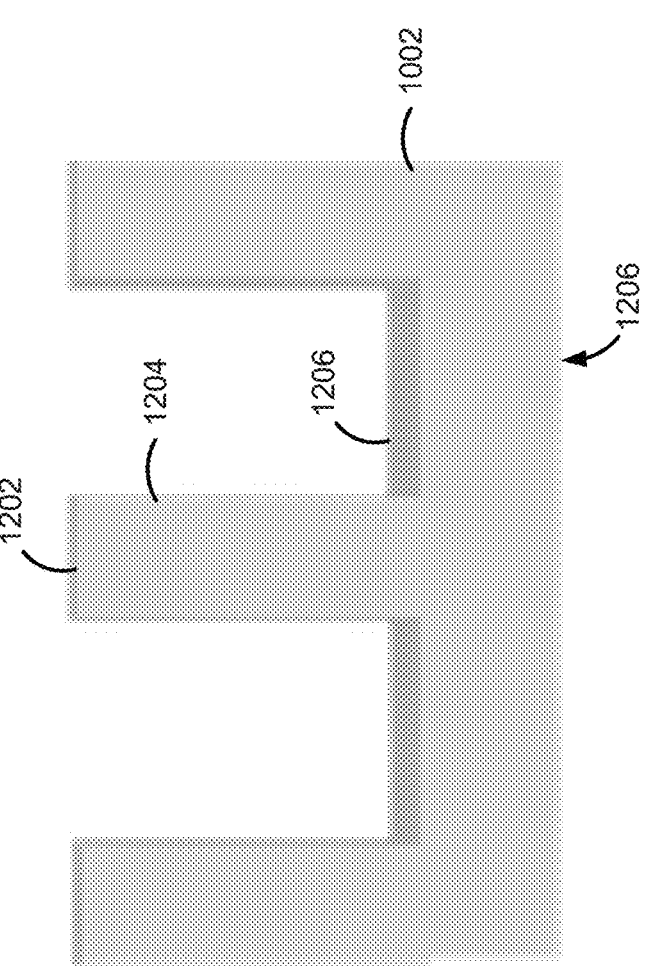

FIG. 12 illustrates structure 1200 after inhibition segment 911. As illustrated, inhibition segment 911 can be configured to preferentially or topo-selectively deactivate top surface 1202 and/or sidewall surface 1204, relative to bottom surface 1206. Thus, bottom surface 1206 remains active, while top surface 1202 and sidewall surface 1204 are relatively inactive.

During precursor pulse 914/precursor segment 913, a precursor, such as a precursor described herein, is provided to the reaction chamber. Precursor pulse 914 can be the same or similar to step 108. A duration of precursor pulse 914 can be about 0.1 to about 60 s or about 60 to about 300 seconds. A flowrate of the precursor during precursor pulse 914 can be about 50 to about 500 or about 500 to about 3000 sccm.

Figure 13:
Figure 13:
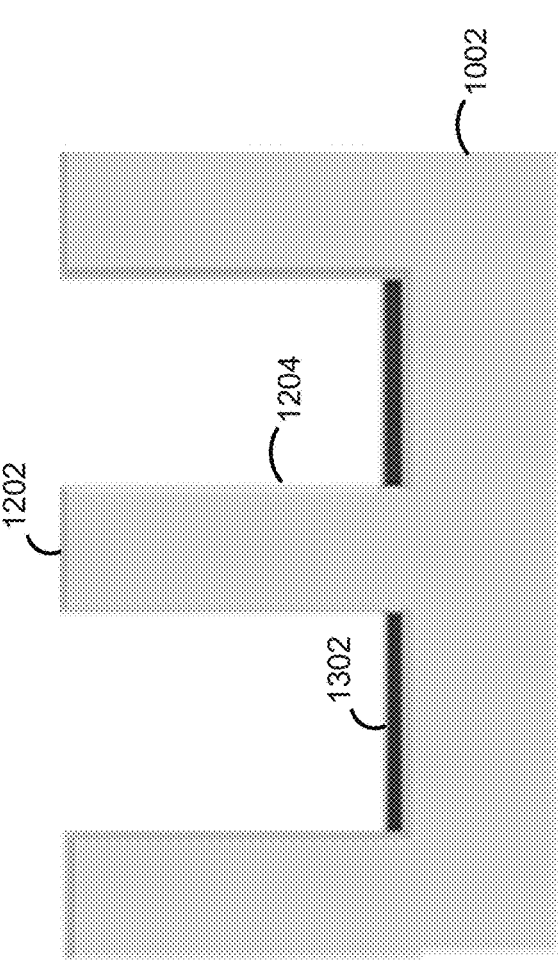
Figure 14:
Figure 14:
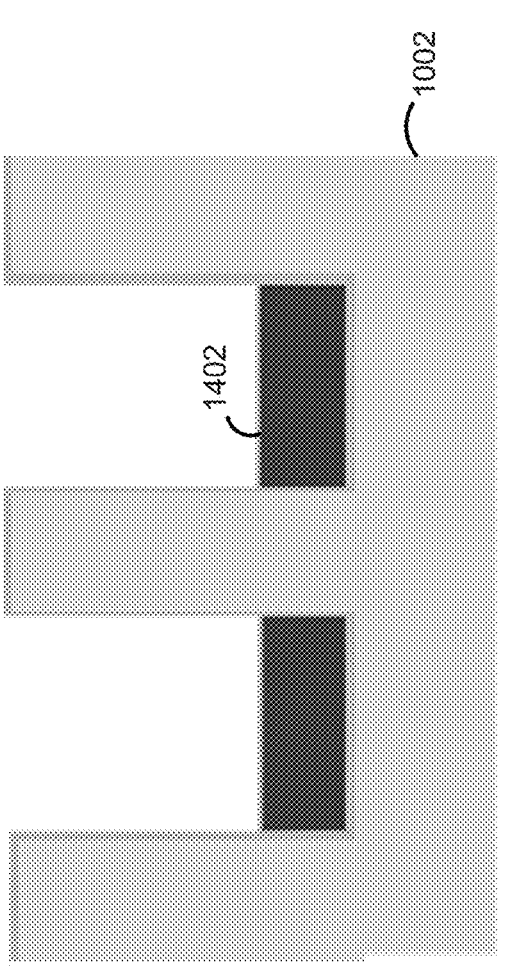

During pulse 914, a precursor can be absorbed onto an activated surface (e.g., bottom surface 1206) to form structure 1300, including topo-selectively deposited material 1302, as illustrated in FIG. 13. Deposition cycle 902 can be repeated a number of times to form structure 1400, including topo-selectively nitride material 1402, as illustrated in FIG. 14.

Figure 15:
Figure 15:
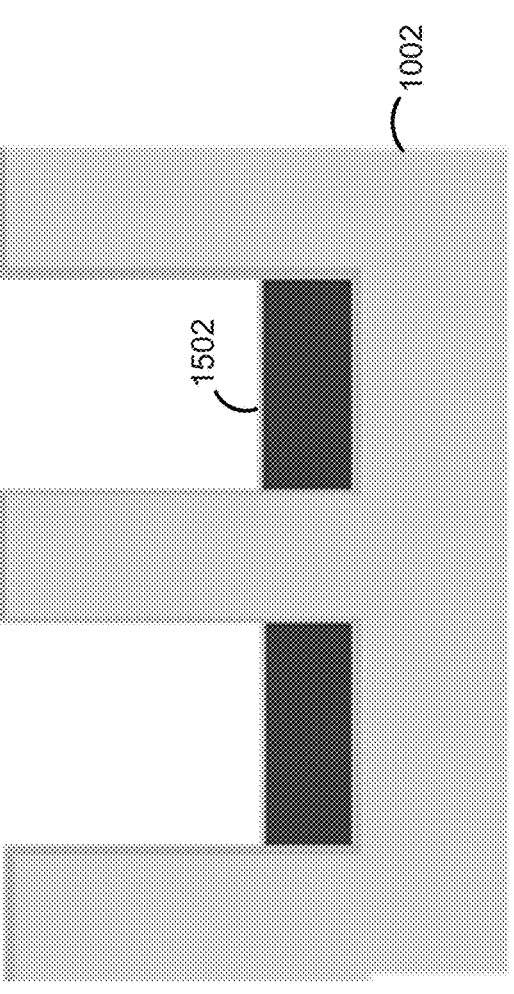

Once a desired amount of nitride material is topo-selectively deposited, the nitride can be treated using treatment power pulse 916 in combination with continued inhibition agent pulse 908 to form structure 1500, including treated material 1502, as illustrated in FIG. 15.

Exemplary process conditions for the method illustrated with timing sequence 900 are provided below in Table 3. The values provided in Table 3 are merely exemplary and are not meant to limit the scope of the application.

TABLE 3

|  |  | Activation (909) | Inhibition (911) | Feed (913) | Treatment (904) |
|---|---|---|---|---|---|
| SUS temp | [C.] | 400 | 400 | 400 | 400 |
| Inhibition agent flow | [slm] | 6 | 6 | 6 | 6 |
| Carrier (e.g., $N_2$) | [slm] | 3 | 3 | 3 | 3 |
| Activation agent flow | [slm] | 0.1 | 0 | 0.1 | 0 |
| Ar flow | [slm] | 0 | 5 | 0 | 0 |
| Pressure | [Pa] | 400 | 666 | 400 | 2000 |
| Electrode gap | [mm] | 15 | 15 | 15 | 15 |
| Plasma duration | [s] | 1 | 3 | NA | 60 |
| Plasma power | [W] | 145 | 200 | NA | 800 |
| Precursor | [s] | NA | NA | 0.3 | NA |

Further described herein is a semiconductor processing apparatus or system. The system comprises a reaction chamber. The reaction chamber comprises a substrate support that is arranged for supporting a substrate. The substrate comprises one or more structures—e.g., as described herein. The system further comprises a heater that is constructed and arranged to heat the substrate in the reaction chamber. The system further comprises a plasma module. The plasma module comprises a (e.g., radio frequency) power source that is constructed and arranged to generate a plasma in the reaction chamber. The system further comprises one or more material precursor sources, such as one or more silicon precursor sources, that are in fluid connection with the reaction chamber via one or more precursor valves. The system further comprises a controller. The controller is configured for causing the apparatus to perform a method as described herein.

Optionally, the system is configured for providing the precursor to the reaction chamber by means of a carrier gas. Suitable carrier gases include noble gases. In other words, in some embodiments, the system comprises a gas injection system comprising a precursor delivery system that employs a carrier gas for carrying the material precursor to one or more reaction chambers.

Figure 16:
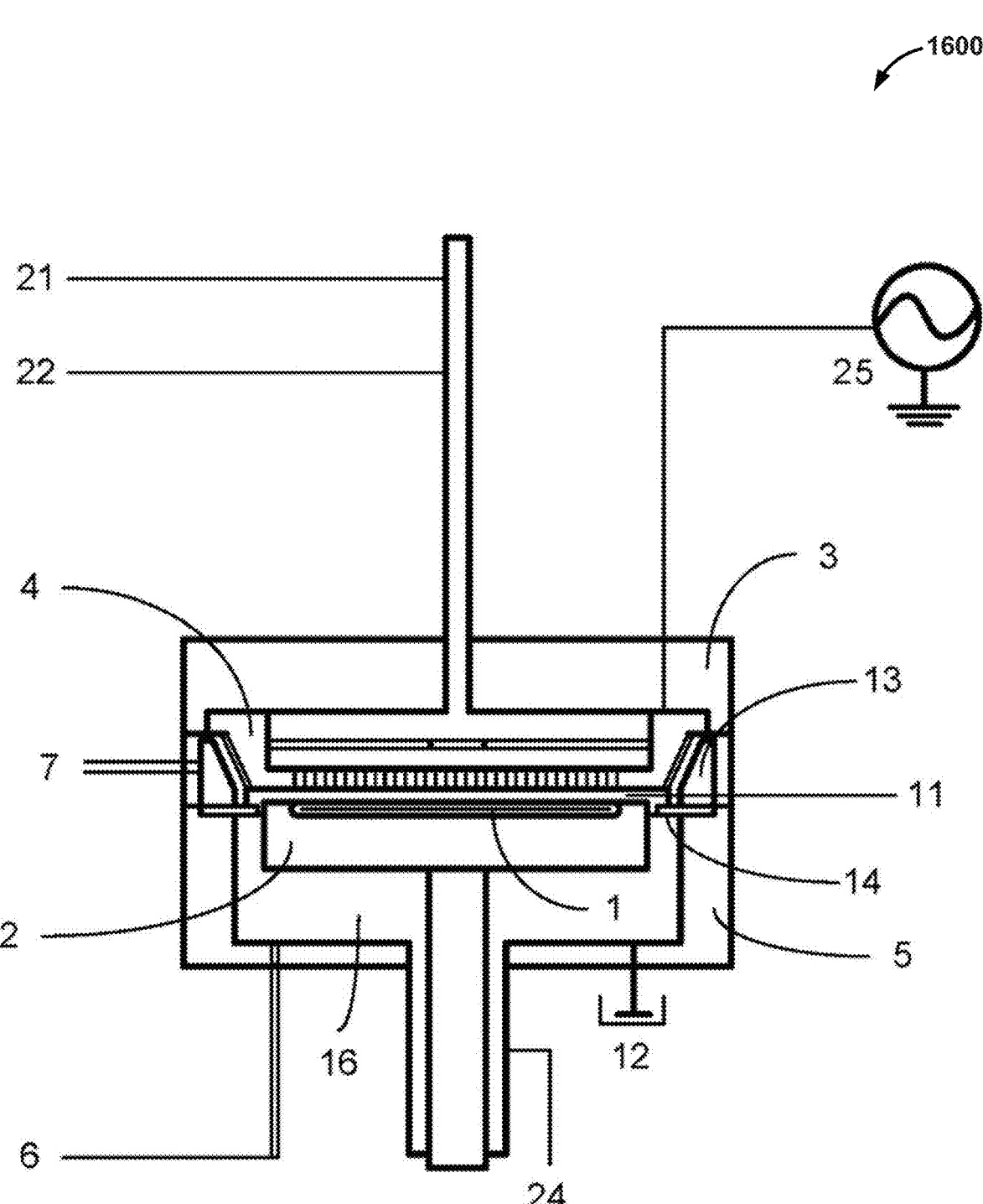
FIG. 16 illustrates a system in accordance with yet further examples of the disclosure.

The presently provided methods may be executed in any suitable apparatus, including in an embodiment of a system illustrated in FIG. 16, which is a schematic view of a plasma-enhanced atomic layer deposition (PEALD) apparatus 1600, usable in embodiments of exemplary methods described herein. In this figure, by providing a pair of electrically conductive flat-plate electrodes 2,4 in parallel and facing each other in the interior 11 (reaction zone) of a reaction chamber 3, applying RF power (e.g., between 100 KHz to 2 GHz or at 13.56 MHz and/or 27 MHz) from a power source 25 to one side, and electrically grounding the other side 12, a plasma can be generated between the electrodes. Of course, and in some embodiments, system 1600 can be configured for generating a plasma intermittently. For example, there may be no need for the semiconductor processing apparatus to generate a plasma during the steps when a precursor is provided to the reaction chamber, or during purges between subsequent processing steps, and no RF power need be applied to any one of the electrodes during those steps or purges. A temperature regulator may be provided in a lower stage 2, i.e., the lower electrode 2. A substrate 1 is placed thereon and its temperature can be set at a desired temperature or temperature range. The upper electrode 4 can serve as a shower plate as well, and various gases, such as a plasma gas, a reactant gas and/or a dilution gas, if any, as well as a precursor gas, can be introduced into the reaction chamber 3 through a first gas line 21 and a second gas line 22, respectively, and through the shower plate 4. Additionally, in the reaction chamber 3, a circular duct 13 with an exhaust line 17 is provided, through which the gas in the interior 11 of the reaction chamber 3 is exhausted. Additionally, a transfer chamber 5 is disposed below the reaction chamber 3 and is provided with a gas seal line 24 to introduce seal gas into the interior 11 of the reaction chamber 3 via the interior 16 of the transfer chamber 5, wherein a separation plate 14 for separating the reaction zone and the transfer zone is provided. Note that a gate valve through which a wafer may be transferred into or from the transfer chamber 5 is omitted from this figure. The transfer chamber is also provided with an exhaust line 6. In some embodiments, the deposition of the material and/or treatment are performed in the same reaction space, so that all the steps can be conducted without any need for intermediate steps of evacuating reaction chambers, pumping down reaction chambers, or exposing the substrate to atmospheric air.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A topology-selective deposition method comprising the steps of:

providing a substrate comprising patterned structures on a surface of the substrate, the patterned structures each comprising a top surface, a bottom surface, and a sidewall surface therebetween;

performing an inhibition step for a first time period, wherein the inhibition process comprises providing an inhibition agent comprising a first nitrogen-containing gas for the first time period to form an inhibited surface on one or more of the top surface, the bottom surface, and the sidewall surface;

performing an activation step comprising providing a deposition promotion agent comprising a second nitrogen-containing gas to form an activated surface on one or more of the top surface, the bottom surface, and the sidewall surface relative to one or more of the other of the top surface, the bottom surface, and the sidewall surface; and performing a formation step after the inhibition process and the activation process, providing a precursor to react with the activated surface to thereby selectively form material comprising a nitride on the activated surface, wherein the deposition promotion agent is provided after the start of the first time period and throughout the formation step, wherein the first nitrogen-containing gas and the second nitrogen-containing gas differ.

2. The method according to claim 1, wherein the inhibition step comprises forming a plasma using the first nitrogen-containing gas.

3. The method according to claim 1, wherein the inhibition step comprises thermally activating the first nitrogen-containing gas to react with the surface.

4. The method according to claim 1, wherein the activation step comprises forming a plasma using the second nitrogen-containing gas for a second time period, wherein the second time period is after the first time period and before providing the precursor.

5. The method according to claim 1, wherein the formation step does not comprise applying a plasma power.

6. The method according to claim 1, wherein the first nitrogen-containing gas is selected from the group consisting of a mixture of hydrogen and nitrogen, ammonia, hydrazine, and hydrazine derivatives.

7. The method according to claim 1, wherein the second nitrogen-containing gas does not comprise hydrogen.

8. The method according to claim 7, wherein the second nitrogen-containing gas is selected from the group consisting of nitrogen ($N_2$), alone or with one or more of argon and helium.

9. The method according to claim 1, wherein the second nitrogen-containing gas comprises hydrogen.

10. The method according to claim 1, wherein the first nitrogen-containing gas does not comprise hydrogen.

11. The method according to claim 1, wherein the material selectively forms on the top surface relative to the bottom surface and the sidewall.

12. The method according to claim 1, wherein the material selectively forms on the bottom surface relative to the top surface and the sidewall.

13. The method according to claim 1, wherein the material selectively forms on the bottom surface and the top surface relative to the sidewall.

14. The method according to claim 1, wherein the precursor is selected from the group consisting of silanes, silylamines, halosilanes, and alkyl and halogen-substituted halines.

15. The method according to claim 1, wherein the precursor is selected from the group consisting of halogenated silicon compounds.

16. The method according to claim 1, wherein the nitride comprises one or more of silicon nitride, silicon carbon nitride, Titanium nitride (TiN), molybdenum nitride (MON), gallium nitride (GaN), hafnium nitride (HfN), zirconium nitride (ZrN), and tungsten nitride (WN).

17. The method according to claim 1, further comprising a post-deposition plasma-treatment step comprising providing nitrogen ($N_2$) and forming a plasma.

18. The method according to claim 1, further comprising a step of removing a portion of the material from the sidewall.

19. A topology-selective deposition method comprising the steps of:

providing a substrate comprising patterned structures on a surface of the substrate, the patterned structures each comprising a top surface, a bottom surface, and a sidewall surface therebetween;

performing an activation step for a first time period, the activation process comprising providing a deposition promotion agent comprising a second nitrogen-containing gas for the first time period to form an activated surface on one or more of the top surface, the bottom surface, and the sidewall surface relative to one or more of the other of the top surface, the bottom surface, and the sidewall surface;

performing an inhibition step comprising providing an inhibition agent comprising a first nitrogen-containing gas after the first time period to form an inhibited surface on one or more of the top surface, the bottom surface, and the sidewall surface; and performing a formation step after the first time period, providing a precursor to react with the activated surface to thereby selectively form material comprising a nitride on the activated surface, wherein the inhibition agent is provided throughout the inhibition step and the formation step, wherein the first nitrogen-containing gas and the second nitrogen-containing gas differ.

20. The method of claim 19, wherein the formation step comprises forming a plasma.

* * * * *